(12) United States Patent
Sundaram

(10) Patent No.: US 10,690,836 B2
(45) Date of Patent: Jun. 23, 2020

(54) DISPLAY CARRIER ATTACHED LIGHT BAR FOR BACKLIT DISPLAYS

(71) Applicant: INTEL CORPORATION, Santa Clara, CA (US)

(72) Inventor: Arvind Sundaram, Bangalore (IN)

(73) Assignee: INTEL CORPORATION, Santa Clara, CA (US)

( * ) Notice: Subject to any disclaimer, the term of this patent is extended or adjusted under 35 U.S.C. 154(b) by 445 days.

(21) Appl. No.: 15/163,598

(22) Filed: May 24, 2016

(65) Prior Publication Data

US 2016/0377797 A1    Dec. 29, 2016

(30) Foreign Application Priority Data

Jun. 24, 2015    (IN) .......................... 1881/DEL/2015

(51) Int. Cl.
| | |
|---|---|
| H05K 3/06 | (2006.01) |
| F21V 8/00 | (2006.01) |
| G09G 3/34 | (2006.01) |
| G09G 3/36 | (2006.01) |
| H05K 1/02 | (2006.01) |
| H05K 3/34 | (2006.01) |
| H05K 1/05 | (2006.01) |

(52) U.S. Cl.
CPC ......... *G02B 6/0068* (2013.01); *G02B 6/0073* (2013.01); *G02B 6/0083* (2013.01); *G09G 3/3406* (2013.01); *G09G 3/36* (2013.01); *H05K 1/0209* (2013.01); *H05K 3/064* (2013.01); *H05K 3/3431* (2013.01); *H05K 1/056* (2013.01); *H05K 2201/0999* (2013.01); *H05K 2201/10106* (2013.01); *H05K 2201/10136* (2013.01); *Y02P 70/613* (2015.11)

(58) Field of Classification Search
CPC ....................................... H05K 3/064
USPC .......................... 345/102; 216/13–21, 41–51
See application file for complete search history.

(56) References Cited

U.S. PATENT DOCUMENTS

| | | | |
|---|---|---|---|
| 6,103,134 A * | 8/2000 | Dunn | H01F 41/041 216/17 |
| 2006/0268551 A1 | 11/2006 | Mok et al. | |
| 2010/0309107 A1 * | 12/2010 | Muroi | G02F 1/133603 345/88 |
| 2011/0069252 A1 | 3/2011 | Cho et al. | |
| 2011/0176086 A1 | 7/2011 | Sekiguchi et al. | |
| 2012/0019742 A1 | 1/2012 | Chang et al. | |
| 2014/0254141 A1 | 9/2014 | McRae | |
| 2016/0035477 A1 * | 2/2016 | Yeh | H01F 27/2804 320/108 |

OTHER PUBLICATIONS

International Search Report and Written Opinion received for PCT Patent Application No. PCT/US2016/033971, dated Aug. 16, 2016, 13 pages.

* cited by examiner

*Primary Examiner* — Michael Pervan

(57) ABSTRACT

Disclosed herein are techniques to incorporate a light bar for a backlit liquid crystal display (LCD) onto a display carrier for the display. In particular, a display carrier for a display stack may have traces formed thereon and light emitting diodes (LEDs) disposed on the display carrier operably coupled to the traces. The LEDs to provide light to illuminate pixels in the display.

25 Claims, 9 Drawing Sheets

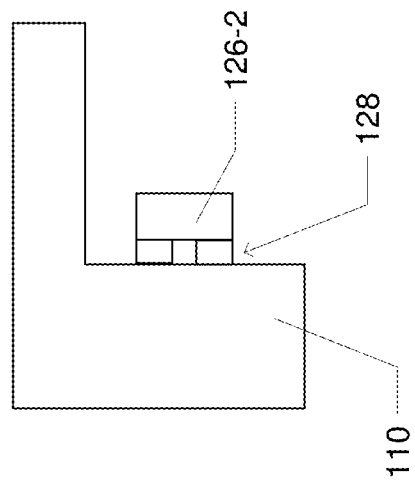
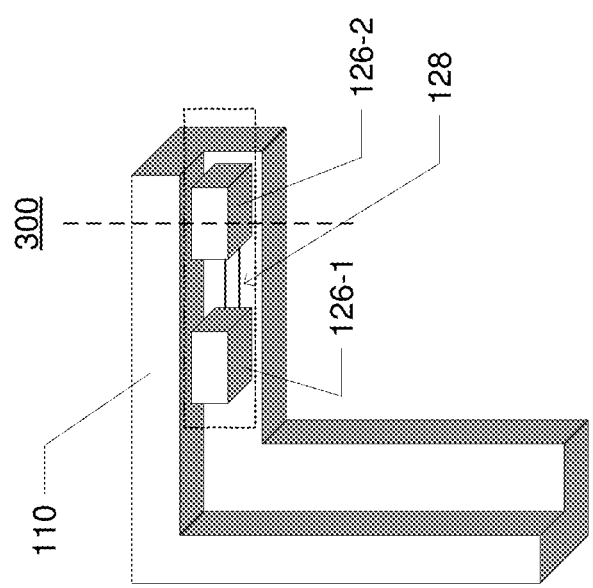
FIG. 3A
FIG. 3B

500

Apply thermal glue to a display carrier.
510

Place a layer of electrically conductive material onto the thermal glue.
520

Etch away portions of the electrically conductive material to form one or more traces.
530

Apply an adhesive material to the display carrier.
540

Place an LED on the display carrier over the adhesive material.
550

FIG. 5

DISPLAY CARRIER ATTACHED LIGHT BAR FOR BACKLIT DISPLAYS

CROSS-REFERENCE TO RELATED APPLICATIONS

This application claims the benefit of and priority to previously filed India Patent Application Serial Number 1881/DEL/2015 filed Jun. 24, 2015, the subject matter of which is incorporated herein by reference in its entirety.

TECHNICAL FIELD

Embodiments herein generally relate to display stacks and particularly to light bars, such as, light emitting diode light bars, for backlit displays.

BACKGROUND

Some modern displays utilize light emitting diode (LED) technology as a light source. For example, a liquid crystal display (LCD) may use LEDs as a light source. In general, a number of LEDs are provided in a strip along with a light guide panel to channelize and diffuse the light emitted from the LEDs. One or more strips of LEDs and the light guide panel are combined with other display layers to form an LED backlit LCD display. Such LED backlit displays can be incorporated into a stand alone display or into an all in one computing device, such as, for example, a smart phone, a tablet, or the like. However, with respect to all in one devices; the display components can account for 60% or more of the entire thickness of a device. This is significant as modern trends continue to require thinner and thinner devices.

The present disclosure is directed to the above.

BRIEF DESCRIPTION OF THE DRAWINGS

FIGS. 3A-3B illustrate block diagrams of the LED light bar blocks of packed frames according to various embodiments.

FIG. 5 illustrates a logic flow for manufacturing an LED light bar and display carrier according to an embodiment.

DETAILED DESCRIPTION

Various embodiments may be generally directed to a display carrier for an LED backlit display where the LEDs are directly mounted to the display carrier. In particular, the present disclosure may be implemented to provide a display carrier having LEDs mounted onto the display carrier, the LEDs to provide light to a light guide panel. Said differently, the display carrier may be used as the substrate to which LEDs are mounted. This is significantly different than other techniques where strips of LEDs are formed using conventional printed circuit boards (PCBs) as the substrate. These strips are then mounted onto the display carrier during assembly of the display stack.

As can be appreciated by those of ordinary skill in the art, LEDs often have thermal constraints and can generate a significant amount of heat during operation. As such, LEDs are often mounted onto a heat sink or other thermal dissipation substrate. Accordingly, with conventional light bars for LED backlit displays, the light bar is formed using metal core PCBs (MCPCBs). In order to provide the necessary thermal dissipation, the thickness of the MCPCBs is often constrained to being 4 millimeters or greater. Therefore, conventional light bars mounted on MCPCBs significantly limit the amount to which the thickness of LED backlit displays can be reduced.

However, the present disclosure provides for forming traces and mounting the LEDs directly on the display carrier frame. As such, the thickness of the entire display component can be reduced.

Figure 1:
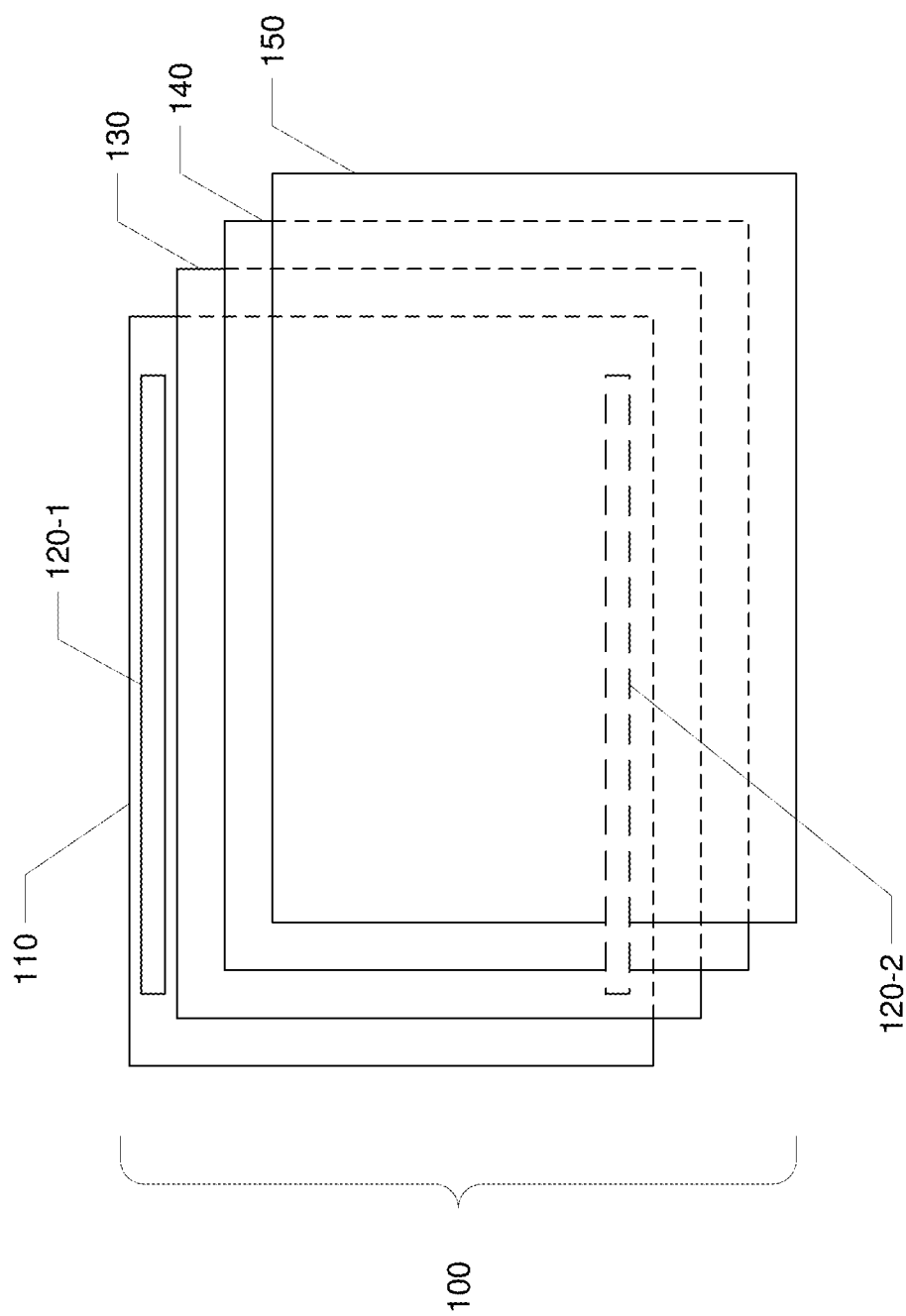
FIG. 1 illustrates a display stack including a display carrier and LED light bar according to an embodiment.

FIG. 1 illustrates a block diagram of a display stack 100. In various examples, the display stack 100 may include a display carrier 110, LED backlight portions 120-a, a light guide panel (LGP) layer 130, an LCD layer 140, and a protective layer 150. It is important to note, that the display stack 100 can include more layers than depicted, less layers than depicted, or different configurations of layers than depicted. For example, reflective layers, diffusive layers, or the like may be included. However, it is noted that an exhaustive depiction and listing of the number and variety of layers that may be included in the display stack 100 is not made for purposes of brevity. The components of the display stack 100 depicted in FIG. 1 are selected for purposes of clarity of presentation only and not to be limiting. Importantly, the display stack 100 includes the display carrier 110 with LED backlight portions 120-a formed or mounted onto the display carrier 110. In particular, the display carrier 110 is used as the substrate for the LED backlight portions 120-a.

As used herein, "a" is intended to denote a positive integer. As such, the display stack 100 can include one or more LED backlight portions 120-a. FIG. 1 depicts LED backlight portions 120-1 and 120-2. However, the display stack 100, as well as other examples of the present disclosure, can be provided with more of less LED backlight portions 120-a than depicted. With some examples, the display stack 100 may be provided in an "edge lit" type LCD displays. For example, the LED backlight portions 120-1 and 120-2 may be provided on either side of the display stack 100. In some examples, the LED backlight portions 120-1 and 120-2 may be provided on the top and bottom of the display stack 100. In some examples, a single LED backlight portion 120-a may be provided, such as, on one side, on the top, or on the bottom of the display stack 100. With some examples, the display stack 100 may be provided in a "full array" type LCD display. As such, a number of LED backlight portions 120-a may be arrayed along a substantial portion of the display carrier. Furthermore, in some examples, one or more of the LEDs (refer to FIG. 2) of the LED backlight portions 120-a (or a select group of the LEDs) may be individually controlled (e.g., dimmable, or the like). Examples are not limited in these contexts.

The display carrier 110 may be formed from a variety of materials and to a variety of physical dimensions and specifications. It is to be appreciated, that the materials and dimensions of the display carrier 110 may be based on the display and/or device to which the display carrier is to be implemented. In general, the display carrier 110 may be formed from a material having thermal conductive properties. For example, the display carrier 110 may be formed from aluminum, aluminum alloys, magnesium, magnesium alloys, carbon fiber reinforced plastic, annealed pyrolytic graphite, mild steel, or the like.

The LED backlight portions 120-1 and 120-2 may comprise a number of individual LEDs mounted to the display carrier as described herein. More detail regarding the LED backlight portions 120-1 and 120-2 are provided below. The LGP layer 130 may include one or more panels or components to channel and diffuse the light emitted from the LED backlight portions 120-1 and 120-2 to the LCD layer 140. The LCD layer 140 may include one or more panels or components to control portions of the display (e.g., pixels). It is to be appreciated that a variety of LCD technologies exists and the present disclosure may be implemented with any of these or future such display technologies. For example, the present disclosure may be implemented using passive and/or active LCD technology. As a particular example, the LCD layer 140 may include thin-film transistor (TFT) components, twisted nematic (TN) components, in plane switching (IPS) components, vertical alignment (VA) components, and/or the like. The protective layer 150 may comprise one or more films, layers, or components to protect the LCD layer 140 and the display stack 100. For example, the protective layer 150 may be glass, acrylic, or the like.

The display stack 100 may be implemented in a variety of displays and/or devices including displays. For example, the display stack 100 may be implemented in a monitor, a television, a smart phone, a Ultrabook, a tablet, a laptop, a wearable computing device (e.g., a watch, glasses, a headset, or the like), a home automation device (e.g., a thermostat, a control panel, or the like). Furthermore, as noted above, the display stack 100 may include additional and/or different layers than depicted. For example, the display stack 100 may be implemented with various touch (e.g., capacitive, or the like) layers, diffusive layers, privacy layer, pressure layers, etc. Examples are not limited in this context.

Figure 2:
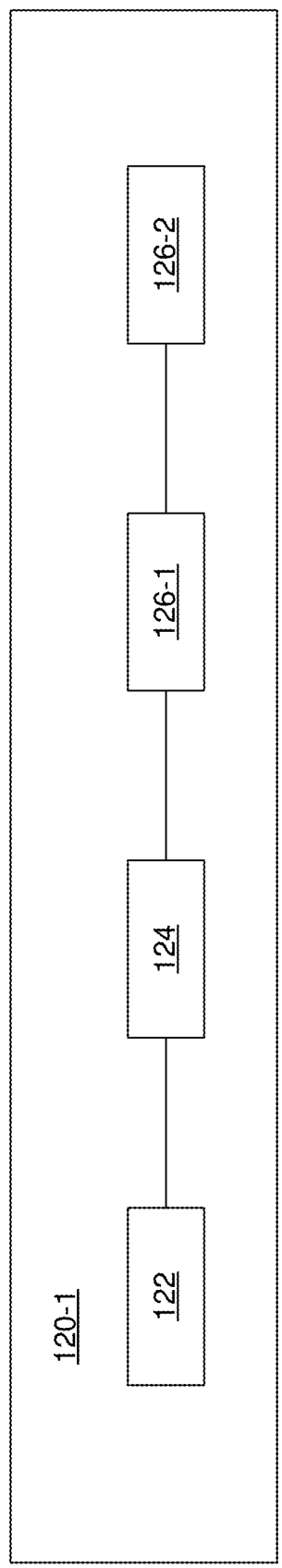
FIG. 2 illustrates a block diagram of an LED light bar of the display stack according to an embodiment.

The LED backlight portions 120-1 and 120-2 are described in greater detail by reference to FIGS. 2, FIGS. 3A-3B, FIGS. 4A-4F, and FIG. 5. In general, FIG. 2 depicts the LED backlight portion 120-1; FIG. 3A depicts a portion of the display carrier 110 and the LED backlight portion 120-1 while FIG. 3B shows a cross section of the display carrier 110 and the LED backlight portion 120-1, showing a single LED; FIGS. 4A-4F and FIG. 5 depict a process for forming the LED backlight portion 120-1 and/or 120-2 on the display carrier 110. It is noted, that FIGS. 4A-4F depict a cross section representation of the display carrier 110 and the LED backlight portion 120-1 represented in FIG. 3B during various steps of the process depicted in FIG. 5. This is done for clarity in discussing forming the LED backlight portion on the display carrier, or said differently, using the display carrier 110 as the substrate for the LED backlight portion 120-1 and/or 120-2.

Turing more specifically to FIG. 2, a block diagram depicting the LED backlight portion 120-1 is depicted. In some examples, the LED backlight portion 120-1 may include a power source 122, a control component 124, and LEDs 126-b, where "b" is a positive integer. LEDs 126-1 and 126-2 are depicted for purposes of clarity. However, it is to be appreciated that the LED backlight portions 120-1 may be implemented with any number of LEDs 126-b. In general, the power source 122 may be any of a variety of power sources, and may depend upon the particular type and power requirements of the LEDs 126-b. The LED backlight portion 120-1 may also optionally include a control component 124. In some examples, the control component 124 may be included in the power source 122. In some examples, the control component 124 may be implemented where dimmable and/or controllable LEDs 126-b are implemented. The control component 124 may be configured (e.g., by logic, hardware, software, or a combination of hardware and software) to control the intensity of light emitted by the LEDs 126-b. Each of the LEDs 126-b may be operably coupled to the power source 122, the controller 124, and/or one or more other of the LEDs 126-b. In some examples, the LEDs 126-b may be operably coupled in a series manner, in a parallel, manner, or in another manner suitable for powering the LEDs 126-b.

Turning more specifically to FIG. 3A, a block diagram of the display carrier 110 and the LED backlight portion 120-1 of the display stack 100 of FIG. 1 are shown. It is noted, that only a portion of the display carrier 100 and the LED backlight portion 120-1 are shown for purposes of clarity. Examples are not limited in this context.

As can be seen, the LED backlight portion 120-1 includes LEDs 126-1 and 126-2. The LEDs 126-1 and 126-2 are attached or disposed directly on the display carrier 110 and may be operably connected via traces 128. It is to be appreciated, that traces 128 can connect the LEDs 126-1 and 126-2 to one or more of the power source 122 (refer to FIG. 2), the control component 124 (refer to FIG. 2), to each other, or other LEDs 126-b (not shown). The traces 128 are formed on the display carrier 110 (refer to FIGS. 4A-4F and FIG. 5). In some examples, the traces 128 may be copper (or other suitable material) and may be formed on the display carrier 110 using various photolithographic techniques (refer to FIGS. 4A-4F and FIG. 5).

Turning more specifically to FIG. 3B, a cross-sectional view of the display carrier 110 and the LED backlight portion 120-1 along the cross-section line 300 of FIG. 3A is shown. As depicted, the LED 126-2 is disposed on the display carrier 110 with the traces 128 between the display carrier 110 and the LED 126-2. It is noted, that a significant reduction in the thickness of the LED backlight portion 120-1 versus conventional LED light bars can be realized. Furthermore, as traces 128 are formed directly on the display carrier 110 and the LEDs 126-b are positioned directly on the display carrier 110, alignment of the display stack 100 is simplified. More specifically, conventional light bars must be placed and aligned on the display carrier during assembly. Accordingly, this alignment process may not be needed when assembling the display stack of the present disclosure. Additionally, the area available for thermal diffusion of heat generated by the LEDs 126-b may be increased over conventional designs, thereby reducing the operating temperature of the LEDs 126-b, potentially increasing the lifespan of the LEDs 126-b and/or the entire display stack 100.

Turning more specifically to FIG. 5, a logic flow 500 for forming an LED backlight portion on a display carrier, according to at least one embodiment of the present disclosure, is illustrated. The logic flow 500 is described with reference to FIGS. 4A-4F and to the LED 126-2 of the LED backlight portion 120-1 and the display carrier 110 of the display stack 100 shown in FIG. 3B. However, the logic flow 500 may be implemented to form LED backlight portions or LED light bars for backlit LCD displays on a display carrier having a different arrangement than depicted in these figures. Examples are not limited in this context.

Figure 4A:
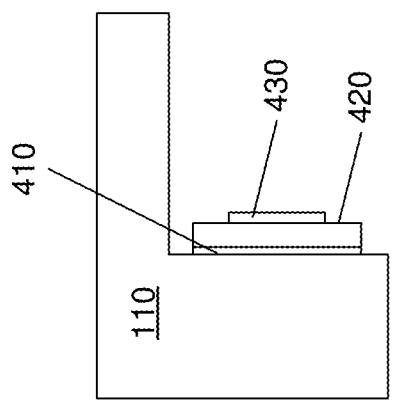
FIGS. 4A-4F illustrate block diagrams of an LED light bar and display carrier during various stages of manufacture according to an embodiment.
Figure 4B:
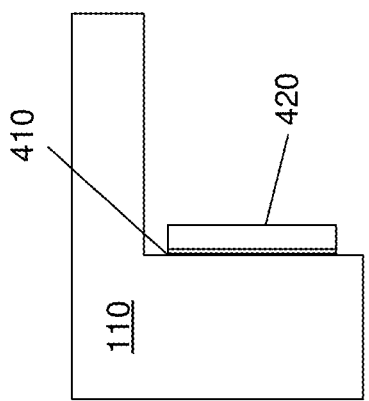

The logic flow 500 may begin at block 510. At block 510 "apply thermal glue to a display carrier," thermal glue may be applied to a display carrier. For example, FIG. 4A depicts the display carrier 110 with thermal glue 410 disposed on a surface of the display carrier. Continuing to block 520 "place a layer of electrically conductive material onto the thermal glue" a layer of electrically conductive material (e.g., copper, gold, conductive alloy, etc.) may be placed on the display carrier and particularly on the thermal glue. For example, FIG. 4B depicts the display carrier 110 with a layer of electrically conductive material 420 placed on the thermal glue 410. Said differently, the electrically conductive material 420 is affixed to the display carrier 110 via the thermal glue 410.

Figure 4C:
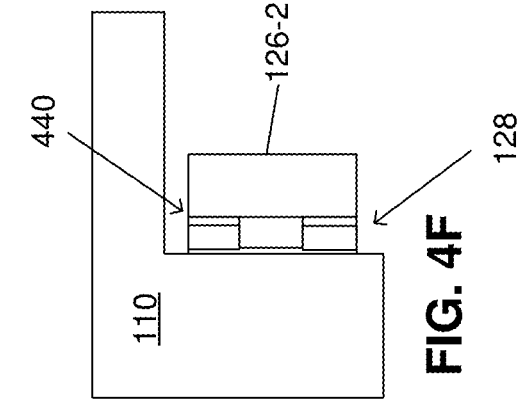
Figure 4D:
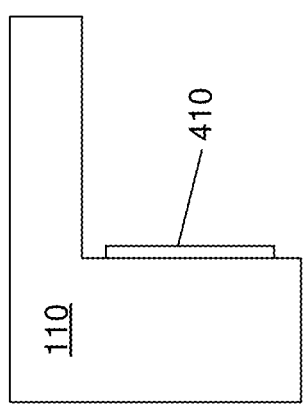

Continuing to block 530 "etch away portions of the electrically conductive material to form one or more traces" portions of the electrically conductive material may be etched away to form one or more traces. For Example, FIGS. 4C and 4D depict a simplified lithographic process that may be implemented to etch away portions of the electrically conductive material to form the one or more traces. Specifically, FIG. 4C depicts a UV resist 430 applied to portions of the electrically conductive material 420. The exposed portions of the electrically conductive material 420 may be etched away by application of radiation, or the like. After which, the UV resist may be washed away, leaving the traces 128. It is noted, that this is a very simplified explanation of lithography and is not intended to be limiting. In particular, the traces 128 may be formed via any suitable method, even other than lithography. For example, in some embodiments, the traces 128 may be printed onto the display carrier 110.

Figure 4E:
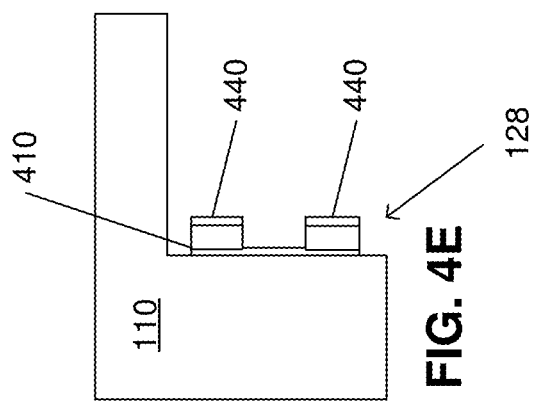
Figure 4F:
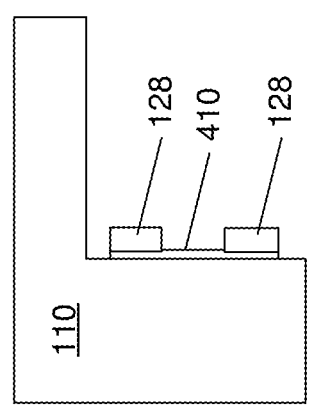

Continuing to block 540 "apply an adhesive material to the display carrier" an adhesive material (e.g., solder paste, or the like) may be applied to the display carrier over the traces 128. For example, FIG. 4E depicts solder paste 440 applied to the traces 128. Continuing to block 550 "place an LED on the display carrier over the adhesive material" an LED may be placed on the display carrier over the adhesive material. For example, FIG. 4F depicts the LED 126-2 placed on the display carrier 110 over the solder paste 440. Said differently, the LED 126-2 may be affixed to the display carrier 110 and electrically coupled to the traces 128 via the solder paste 440.

Figure 6:
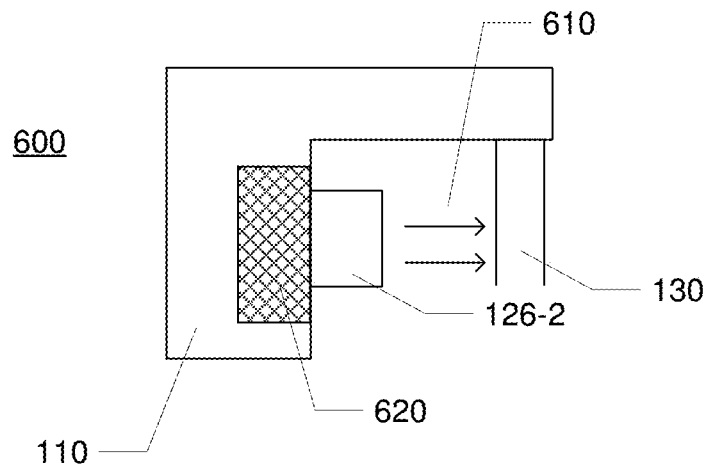
FIG. 6 illustrates a block diagram of a portion of a display stack according to an embodiment.

FIG. 6 illustrates a block diagram of portion of a display stack 600, arranged according to an example of the present disclosure. The display stack 600 may include the display carrier 110 of FIG. 1. The display carrier 110 has LEDs attached thereto, as described above. In particular, this figure illustrates the LED 126-2 directly attached to the display carrier 110 and in thermal communication with the display carrier 110. The LEDs, for example the LED 126-2 emit light 610. The emitted light 610 may be directed to the LGP 130. Furthermore, during operation, or said differently, while the LEDs are emitting light, the LEDs generate heat 620. The heat 620 is dissipated through the display carrier 110, which is thermally attached to the LEDs.

Figure 7:
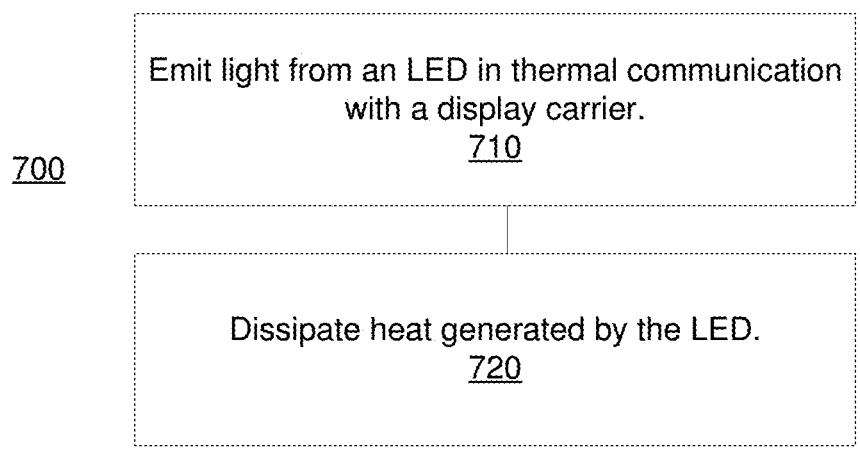
FIG. 7 illustrates a logic flow implemented by an LED light bar and display carrier according to an embodiment.

FIG. 7 illustrates a logic flow 700. The logic flow 700 may be implemented by a display stack, or more specifically, an LED directly attached to a display carrier. Beginning at block 710, "emit light from an LED in thermal communication with a display carrier," the LED 126-2 may emit the light 610. Continuing to block 720, "dissipate heat generated by the LED," the display carrier 110 may dissipate heat 620, which is generated by the LED 126-2 while the LED 126-2 is emitting light 610.

Figure 8:
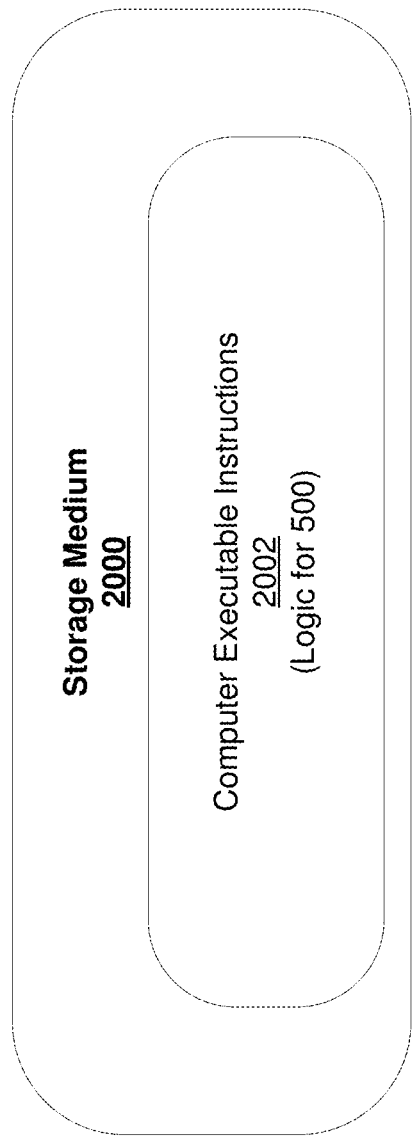
FIG. 8 illustrates a computer readable medium according to an embodiment.

FIG. 8 illustrates an embodiment of a storage medium 2000. The storage medium 2000 may comprise an article of manufacture. In some examples, the storage medium 2000 may include any non-transitory computer readable medium or machine readable medium, such as an optical, magnetic or semiconductor storage. The storage medium 2000 may store various types of computer executable instructions e.g., 2002). For example, the storage medium 2000 may store various types of computer executable instructions to implement technique 500.

Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 9:
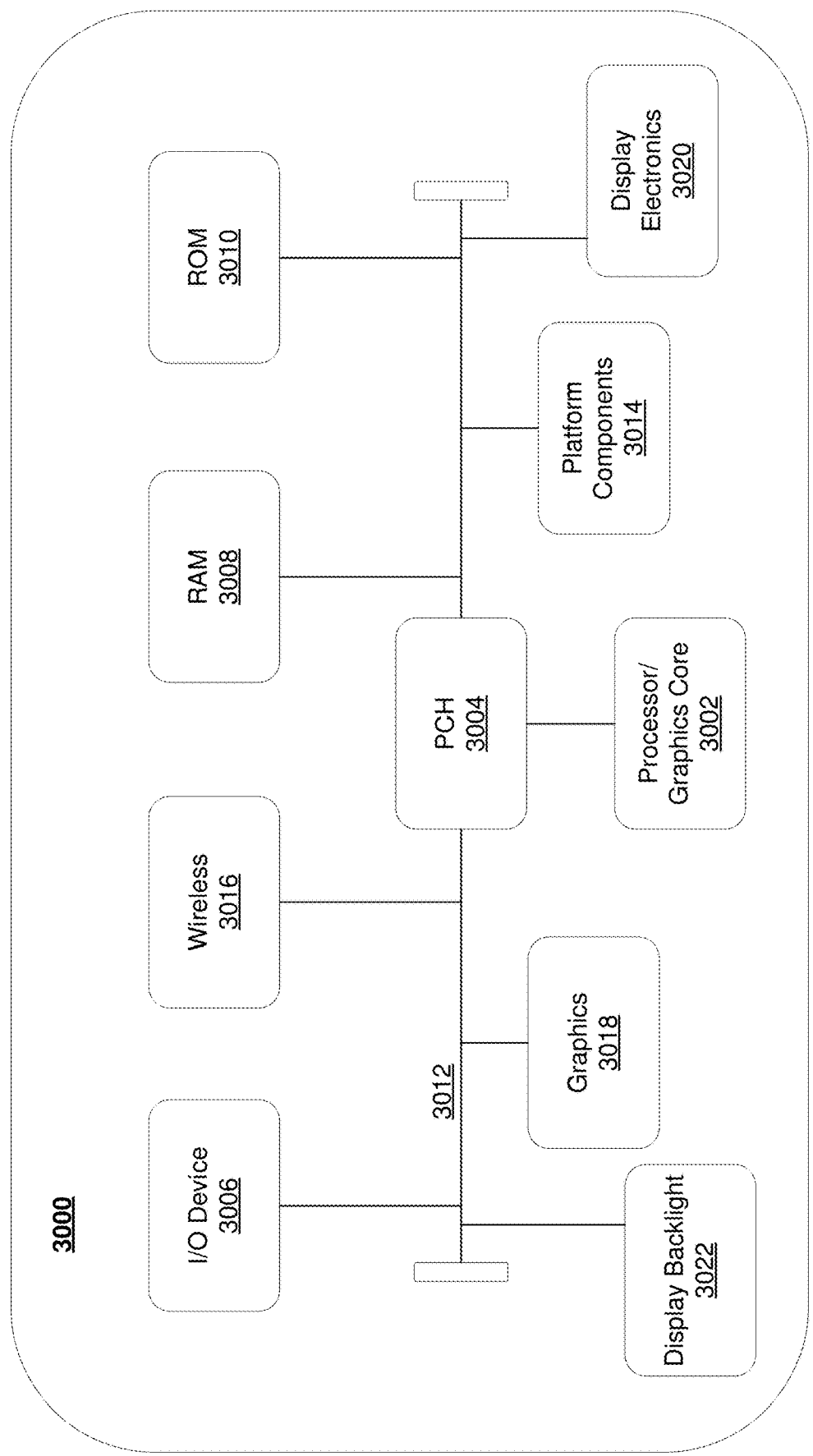
FIG. 9 illustrates another device according to an embodiment.

FIG. 9 is a diagram of an exemplary system embodiment and in particular, depicts a platform 3000, which may include various elements. For instance, this figure depicts that platform (system) 3000 may include a processor/graphics core 3002, a chipset/platform control hub (PCH) 3004, an input/output (I/O) device 3006, a random access memory (RAM) (such as dynamic RAM (DRAM)) 3008, and a read only memory (ROM) 3010, display electronics 3020, display backlight 3022 (e.g., including the backlight portions 120-a, or the like), and various other platform components 3014 (e.g., a fan, a cross flow blower, a heat sink, DTM system, cooling system, housing, vents, and so forth). System 3000 may also include wireless communications chip 3016 and graphics device 3018. The embodiments, however, are not limited to these elements.

As depicted, I/O device 3006, RAM 3008, and ROM 3010 are coupled to processor 3002 by way of chipset 3004. Chipset 3004 may be coupled to processor 3002 by a bus 3012. Accordingly, bus 3012 may include multiple lines.

Processor 3002 may be a central processing unit comprising one or more processor cores and may include any number of processors having any number of processor cores. The processor 3002 may include any type of processing unit, such as, for example, CPU, multi-processing unit, a reduced instruction set computer (RISC), a processor that have a pipeline, a complex instruction set computer (CISC), digital signal processor (DSP), and so forth. In some embodiments, processor 3002 may be multiple separate processors located on separate integrated circuit chips. In some embodiments processor 3002 may be a processor having integrated graphics, while in other embodiments processor 3002 may be a graphics core or cores.

Figure 10:
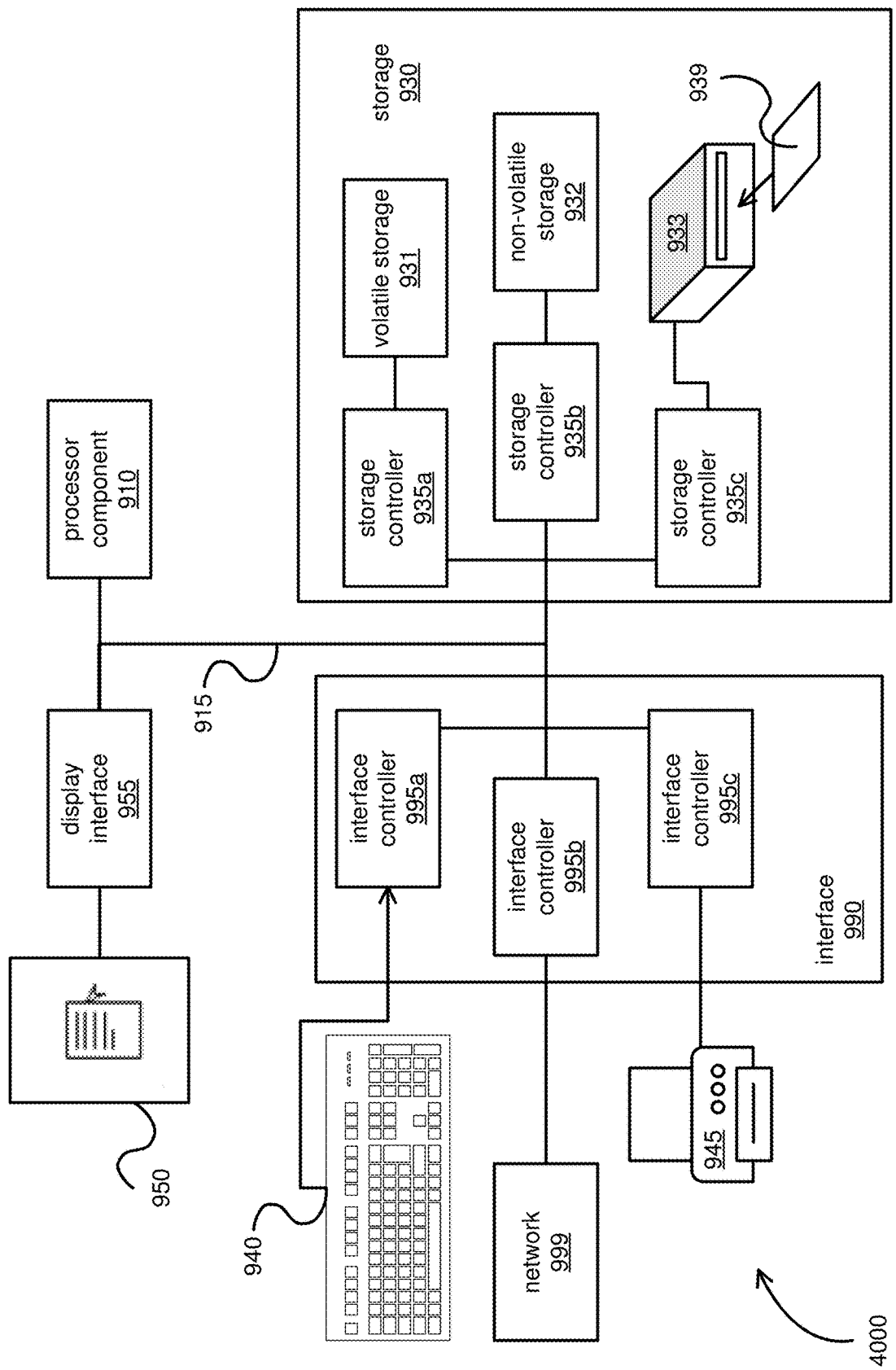
FIG. 10 illustrates still another device according to an embodiment.

FIG. 10 illustrates an embodiment of an exemplary processing architecture 4000 suitable for implementing various embodiments as previously described. More specifically, the processing architecture 4000 (or variants thereof) may be implemented as part of a system including the display stack 100 of FIG. 1.

The processing architecture 4000 includes various elements commonly employed in digital processing, including without limitation, one or more processors, multi-core processors, co-processors, memory units, chipsets, controllers, peripherals, interfaces, oscillators, timing devices, video cards, audio cards, multimedia input/output (I/O) components, power supplies, etc. As used in this application, the terms "system" and "component" are intended to refer to an entity of a computing device in which digital processing is carried out, that entity being hardware, a combination of hardware and software, software, or software in execution, examples of which are provided by this depicted exemplary processing architecture. For example, a component can be, but is not limited to being, a process running on a processor element, the processor element itself, a storage device (e.g., a hard disk drive, multiple storage drives in an array, etc.) that may employ an optical and/or magnetic storage medium, an software object, an executable sequence of instructions, a thread of execution, a program, and/or an entire computing device (e.g., an entire computer). By way of illustration, both an application running on a server and the server can be a component. One or more components can reside within a process and/or thread of execution, and a component can be localized on one computing device and/or distributed between two or more computing devices. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to one or more signal lines. Each message may be a signal or a plurality of signals transmitted either serially or substantially in parallel.

As depicted, in implementing the processing architecture 4000, a computing device incorporates at least a processor element 910, a storage 930, an interface 990 to other devices, and coupling 915. Depending on various aspects of a computing device implementing the processing architecture 4000, including its intended use and/or conditions of use, such a computing device may further incorporate additional components, such as without limitation, a counter element 915.

The coupling 915 incorporates one or more buses, point-to-point interconnects, transceivers, buffers, crosspoint switches, and/or other conductors and/or logic that communicatively couples at least the processor element 910 to the storage 930. The coupling 915 may further couple the processor element 910 to one or more of the interface 990 and the display interface 955 (depending on which of these and/or other components are also present). With the processor element 910 being so coupled by couplings 915, the processor element 910 is able to perform the various ones of the tasks described at length, above, for whichever ones of the computing devices 100, 300 and 600 implement the processing architecture 4000. The coupling 915 may be implemented with any of a variety of technologies or combinations of technologies by which signals are optically and/or electrically conveyed. Further, at least portions of couplings 915 may employ timings and/or protocols conforming to any of a wide variety of industry standards, including without limitation, Accelerated Graphics Port (AGP), CardBus, Extended Industry Standard Architecture (E-ISA), Micro Channel Architecture (MCA), NuBus, Peripheral Component Interconnect (Extended) (PCI-X), PCI Express (PCI-E), Personal Computer Memory Card International Association (PCMCIA) bus, HyperTransport™, QuickPath, Serial ATA (SATA) and the like.

As previously discussed, the processor element 910 may include any of a wide variety of commercially available processors, employing any of a wide variety of technologies and implemented with one or more cores physically combined in any of a number of ways.

As previously discussed, the storage 930 may include one or more distinct storage devices based on any of a wide variety of technologies or combinations of technologies. More specifically, as depicted, the storage 930 may include one or more of a volatile storage 931 (e.g., solid state storage based on one or more forms of RAM technology), a non-volatile storage 932 (e.g., solid state, ferromagnetic, phase change, or other storage not requiring a constant provision of electric power to preserve their contents), and a removable media storage 933 (e.g., removable disc or solid state memory card storage by which information may be conveyed between computing devices). This depiction of the storage 930 as possibly comprising multiple distinct types of storage is in recognition of the commonplace use of more than one type of storage device in computing devices in which one type provides relatively rapid reading and writing capabilities enabling more rapid manipulation of data by the processor element 910 (but possibly using a "volatile" technology constantly requiring electric power) while another type provides relatively high density of non-volatile storage (but likely provides relatively slow reading and writing capabilities).

Given the often different characteristics of different storage devices employing different technologies, it is also commonplace for such different storage devices to be coupled to other portions of a computing device through different storage controllers coupled to their differing storage devices through different interfaces. By way of example, where the volatile storage 931 is present and is based on RAM technology, the volatile storage 931 may be communicatively coupled to coupling 915 through a storage controller 935a providing an appropriate interface to the volatile storage 931 that perhaps employs row and column addressing, and where the storage controller 935a may perform row refreshing and/or other maintenance tasks to aid in preserving information stored within the volatile storage 931. By way of another example, where the non-volatile storage 932 is present and includes one or more ferromagnetic and/or solid-state disk drives, the non-volatile storage 932 may be communicatively coupled to coupling 915 through a storage controller 935b providing an appropriate interface to the non-volatile storage 932 that perhaps employs addressing of blocks of information and/or of cylinders and sectors. By way of still another example, where the removable media storage 933 is present and includes one or more optical and/or solid-state disk drives employing one or more pieces of removable machine-readable storage media 939, the removable media storage 933 may be communicatively coupled to coupling 915 through a storage controller 935c providing an appropriate interface to the removable media storage 933 that perhaps employs addressing of blocks of information, and where the storage controller 935c may coordinate read, erase and write operations in a manner specific to extending the lifespan of the machine-readable storage media 939.

One or the other of the volatile storage 931 or the non-volatile storage 932 may include an article of manufacture in the form of a machine-readable storage media on which a routine comprising a sequence of instructions executable by the processor element 910 may be stored, depending on the technologies on which each is based. By way of example, where the non-volatile storage 932 includes ferromagnetic-based disk drives (e.g., so-called "hard drives"), each such disk drive typically employs one or more rotating platters on which a coating of magnetically responsive particles is deposited and magnetically oriented in various patterns to store information, such as a sequence of instructions, in a manner akin to removable storage media such as a floppy diskette. By way of another example, the non-volatile storage 932 may be made up of banks of solid-state storage devices to store information, such as sequences of instructions, in a manner akin to a compact flash card. Again, it is commonplace to employ differing types of storage devices in a computing device at different times to store executable routines and/or data. Thus, a routine comprising a sequence of instructions to be executed by the processor element 910 may initially be stored on the machine-readable storage media 939, and the removable media storage 933 may be subsequently employed in copying that routine to the non-volatile storage 932 for longer term storage not requiring the continuing presence of the machine-readable storage media 939 and/or the volatile storage 931 to enable more rapid access by the processor element 910 as that routine is executed.

As previously discussed, the interface 990 may employ any of a variety of signaling technologies corresponding to any of a variety of communications technologies that may be employed to communicatively couple a computing device to one or more other devices. Again, one or both of various forms of wired or wireless signaling may be employed to enable the processor element 910 to interact with input/output devices (e.g., the depicted example keyboard 940 or printer 945) and/or other computing devices, possibly through a network (e.g., the network 999) or an interconnected set of networks. In recognition of the often greatly different character of multiple types of signaling and/or protocols that must often be supported by any one computing device, the interface 990 is depicted as comprising multiple different interface controllers 995*a*, 995*b* and 995*c*. The interface controller 995*a* may employ any of a variety of types of wired digital serial interface or radio frequency wireless interface to receive serially transmitted messages from user input devices, such as the depicted keyboard 940. The interface controller 995*b* may employ any of a variety of cabling-based or wireless signaling, timings and/or protocols to access other computing devices through the depicted network 999 (perhaps a network comprising one or more links, smaller networks, or perhaps the Internet). The interface 995*c* may employ any of a variety of electrically conductive cabling enabling the use of either serial or parallel signal transmission to convey data to the depicted printer 945. Other examples of devices that may be communicatively coupled through one or more interface controllers of the interface 990 include, without limitation, microphones, remote controls, stylus pens, card readers, finger print readers, virtual reality interaction gloves, graphical input tablets, joysticks, other keyboards, retina scanners, the touch input component of touch screens, trackballs, various sensors, laser printers, inkjet printers, mechanical robots, milling machines, etc.

Where a computing device is communicatively coupled to (or perhaps, actually incorporates) a display (e.g., the depicted example display 950, which may include the display carrier 110 and LED light bars 120-*a*), such a computing device implementing the processing architecture 4000 may also incorporate the display interface 955. Although more generalized types of interface may be employed in communicatively coupling to a display, the somewhat specialized additional processing often required in visually displaying various forms of content on a display, as well as the somewhat specialized nature of the cabling-based interfaces used, often makes the provision of a distinct display interface desirable. Wired and/or wireless signaling technologies that may be employed by the display interface 955 in a communicative coupling of the display 950 may make use of signaling and/or protocols that conform to any of a variety of industry standards, including without limitation, any of a variety of analog video interfaces, Digital Video Interface (DVI), DisplayPort, etc.

More generally, the various elements of the computing devices 100, 200, and 400 may include various hardware elements, software elements, or a combination of both. Examples of hardware elements may include devices, logic devices, components, processors, microprocessors, circuits, processor elements, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. However, determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Further, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other. Furthermore, aspects or elements from different embodiments may be combined.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims. The detailed disclosure now turns to providing examples that pertain to further embodiments. The examples provided below are not intended to be limiting.

EXAMPLE 1

An apparatus, comprising: a display carrier to receive one or more components of a display stack, the display carrier comprising: a first surface; a trace disposed on the first surface; a first light emitting diode (LED) disposed on the first surface, the first LED in electrical communication with the trace.

EXAMPLE 2

The apparatus of example 1, the first LED in thermal communication with the display carrier.

EXAMPLE 3

The apparatus of example 1, comprising a second LED disposed on the first surface, the second LED in electrical communication with the trace.

EXAMPLE 4

The apparatus of example 3, the first and second LED forming a first LED light bar, the apparatus comprising: a next trace disposed on the first surface; and a third and a fourth LED disposed on the first surface, the third and the fourth LED in electrical communication with the next trace, the third and the fourth LED forming a second LED light bar.

EXAMPLE 5

The apparatus of example 1, comprising a power supply operably coupled to the first LED.

EXAMPLE 6

The apparatus of example 1, comprising a control component operably coupled to the first LED, the control component to communicate a control signal to vary the intensity of the first LED.

EXAMPLE 7

The apparatus of example 1, comprising a light guide panel layer.

EXAMPLE 8

The apparatus of example 1, comprising a light guide panel layer and liquid crystal display layer.

EXAMPLE 9

The apparatus of example 1, comprising a display interface to receive signals to include an indication of display data.

EXAMPLE 10

A system, comprising: a display stack comprising: a display carrier comprising: a first surface; a trace disposed on the first surface; a first light emitting diode (LED) disposed on the first surface, the first LED in electrical communication with the trace; and a liquid crystal display (LCD) layer, the LCD layer comprising at least one active component; a display interface to receive signals to include an indication of display data; and a display controller operably coupled to the first LED, the at least one active component and the display interface, the display controller to cause the display stack to illuminate one or more pixels based on the display data.

EXAMPLE 11

The system of example 10, the LED in thermal communication with the display carrier.

EXAMPLE 12

The system of example 10, comprising a light guide panel (LGP) layer, the LGP layer disposed between the display carrier and the LCD layer.

EXAMPLE 13

The system of example 10, comprising a second LED disposed on the first surface, the second LED in electrical communication with the trace.

EXAMPLE 14

The system of example 13, the first and second LED forming a first LED light bar, the apparatus comprising: a next trace disposed on the first surface; and a third and a fourth LED disposed on the first surface, the third and the fourth LED in electrical communication with the next trace, the third and the fourth LED forming a second LED light bar.

EXAMPLE 15

The system of example 10, comprising a power supply operably coupled to the first LED.

EXAMPLE 16

The system of example 10, comprising a control component operably coupled to the first LED, the control component to communicate a control signal to vary the intensity of the first LED.

EXAMPLE 17

A method comprising: forming one or more electrically conductive traces on a display carrier; securing at least one light emitting diode (LED) on the display carrier, the at least one LED electrically coupled to at least one of the one or more traces.

EXAMPLE 18

The method of example 17, the LED to provide light for a light guide panel of a display stack.

EXAMPLE 19

The method of example 17, the display carrier a part of a display stack.

EXAMPLE 20

The method of example 17, forming the one of more electrically conductive traces comprising: applying thermal glue to the display carrier; placing a layer of electrically conductive material onto the thermal glue; curing the thermal glue; and etching away portions of the electrically conductive material to form the one or more traces.

EXAMPLE 21

The method of example 20, etching away portions of the electrically conductive material comprising: applying a resist over portions of the electrically conductive material; selectively exposing portions of the electrically conductive material to radiation to remove portions of the electrically conductive material; and removing the resist.

EXAMPLE 22

The method of example 17, securing at least one light emitting diode (LED) on the display carrier comprising: applying an adhesive material to the display carrier; and placing the LED on the display carrier over the adhesive material.

EXAMPLE 23

The method of example 22, the adhesive material comprising solder.

EXAMPLE 24

The method of example 17, further comprising assembling a display stack to include the display carrier.

EXAMPLE 25

The method of example 17, the display stack to include a light guide panel layer and a liquid crystal display layer.

EXAMPLE 26

An apparatus, comprising: display carrier means to receive one or more components of a display stack, the display carrier means comprising: a first surface; a electrical conducting means disposed on the first surface; a first light emitting means disposed on the first surface, the first light emitting means in electrical communication with the electrical conducting means.

EXAMPLE 27

The apparatus of example 26, the first light emitting means in thermal communication with the display carrier means.

EXAMPLE 28

The apparatus of example 26, comprising a second light emitting means disposed on the first surface, the second light emitting means in electrical communication with the electrical conducting means.

EXAMPLE 29

The apparatus of example 28, the first and second light emitting means forming a first light bar, the apparatus comprising: a next electrical conducting means disposed on the first surface; and a third and a fourth light emitting means disposed on the first surface, the third and the fourth light emitting means in electrical communication with the next electrical conducting means, the third and the fourth light emitting means forming a second light bar.

EXAMPLE 30

The apparatus of example 26, comprising power supply means operably coupled to the first light emitting means.

EXAMPLE 31

The apparatus of example 26, comprising a control component operably coupled to the first light emitting means, the control component to communicate a control signal to vary the intensity of the first light emitting means.

EXAMPLE 32

The apparatus of example 26, comprising light guide panel layer means.

EXAMPLE 33

The apparatus of example 26, comprising light guide panel layer means and liquid crystal display layer means.

EXAMPLE 34

The apparatus of example 26, comprising display interface means to receive signals to include an indication of display data.

EXAMPLE 35

A method comprising: emitting light from one or more light emitting diodes (LEDs) in thermal communication with a display carrier of a display stack; and dissipating heat generated by the LEDs, the heat dissipated through the display carrier.

EXAMPLE 36

The method of example 35, comprising directing the emitted light at a light guide panel of the display stack.

EXAMPLE 37

The method of example 35, the one or more LEDs directly attached to the display carrier using a thermal adhesive.

The invention claimed is:

1. An apparatus, comprising:
   a display carrier to carry a plurality of components of a display stack including at least a light guide panel (LGP) layer, the display carrier comprising:
   a first surface;
   a trace disposed on the first surface; and
   a first light emitting diode (LED) directly coupled to the first surface, the first LED in electrical communication with the trace and in thermal communication with the first surface, the display carrier arranged to carry the LGP layer such that the LGP layer is in optical communication with the first LED.

2. The apparatus of claim 1, comprising a second LED disposed on the first surface, the second LED in electrical communication with the trace.

3. The apparatus of claim 2, the first and second LED forming a first LED light bar, the apparatus comprising:
   a next trace disposed on the first surface; and
   a third and a fourth LED disposed on the first surface, the third and the fourth LED in electrical communication with the next trace, the third and the fourth LED forming a second LED light bar.

4. The apparatus of claim 1, comprising a power supply operably coupled to the first LED.

5. The apparatus of claim 1, comprising a control component operably coupled to the first LED, the control component to communicate a control signal to vary the intensity of the first LED.

6. The apparatus of claim 1, comprising the LGP layer.

7. The apparatus of claim 1, comprising the LGP layer and a liquid crystal display layer.

8. The apparatus of claim 1, comprising a display interface to receive signals to include an indication of display data.

9. The apparatus of claim 1, wherein the display carrier and the trace are configured as a circuit board for the first LED.

10. A system, comprising:
    a display stack comprising:
    a display carrier to carry a plurality of component of the display stack including at least a light guide panel (LGP) layer, the display carrier comprising:
    a first surface;
    a trace disposed on the first surface;
    a first light emitting diode (LED) directly coupled to the first surface, the first LED in electrical communication with the trace and in thermal communication with the first surface, the display carrier arranged to carry the LGP layer such that the LGP layer is in optical communication with the first LED; and
    a liquid crystal display (LCD) layer, the LCD layer comprising at least one active component;
    a display interface to receive signals to include an indication of display data; and
    a display controller operably coupled to the first LED, the at least one active component and the display interface, the display controller to cause the display stack to illuminate one or more pixels based on the display data.

11. The system of claim 10, comprising the LGP layer, the LGP layer disposed between the display carrier and the LCD layer.

12. The system of claim 10, comprising a second LED disposed on the first surface, the second LED in electrical communication with the trace.

13. The system of claim 12, the first and second LED forming a first LED light bar, the system comprising:
    a next trace disposed on the first surface; and
    a third and a fourth LED disposed on the first surface, the third and the fourth LED in electrical communication with the next trace, the third and the fourth LED forming a second LED light bar.

14. The system of claim 10, comprising a power supply operably coupled to the first LED.

15. The system of claim 10, comprising a control component operably coupled to the first LED, the control component to communicate a control signal to vary the intensity of the first LED.

16. The system of claim 10, wherein the display carrier and the trace are configured as a circuit board for the first LED.

17. A method comprising:
    forming one or more electrically conductive traces on a display carrier;
    securing at least one light emitting diode (LED) to a first surface of the display carrier, the at least one LED electrically coupled to at least one of the one or more traces and thermally coupled to the first surface, the display carrier arranged to carry a light guide panel (LGP) layer of a display stack such that the LGP layer is in optical communication with the first LED.

18. The method of claim 17, the display carrier a part of a display stack.

19. The method of claim 17, forming the one of more electrically conductive traces comprising:
    applying thermal glue to the display carrier;
    placing a layer of electrically conductive material onto the thermal glue;
    curing the thermal glue; and
    etching away portions of the electrically conductive material to form the one or more traces.

20. The method of claim 19, etching away portions of the electrically conductive material comprising:
    applying a resist over portions of the electrically conductive material;
    selectively exposing portions of the electrically conductive material to radiation to remove portions of the electrically conductive material; and
    removing the resist.

21. The method of claim 17, securing at least one light emitting diode (LED) on the display carrier comprising:
    applying an adhesive material to the display carrier; and
    placing the LED on the display carrier over the adhesive material.

22. The method of claim 21, the adhesive material comprising solder.

23. The method of claim 17, further comprising assembling a display stack to include the display carrier.

24. The method of claim 23, the display stack to include the LGP layer and a liquid crystal display layer.

25. The method of claim 17, wherein the display carrier and the trace are configured as a circuit board for the first LED.

* * * * *